United States Patent
Muto et al.

(10) Patent No.: US 6,634,159 B1
(45) Date of Patent: Oct. 21, 2003

(54) TAPING APPARATUS FOR ELECTRONIC COMPONENTS

(75) Inventors: Kenichi Muto, Ota (JP); Ryuichi Komatsu, Oizumi-machi (JP); Yasuhiro Tanaka, Kasai (JP); Akio Watanabe, Ota (JP); Yasuhiro Oribe, Kasai (JP)

(73) Assignee: Sanyo Electric Co., Ltd., Gunma (JP)

( * ) Notice: Subject to any disclaimer, the term of this patent is extended or adjusted under 35 U.S.C. 154(b) by 58 days.

(21) Appl. No.: 09/662,175

(22) Filed: Sep. 14, 2000

(30) Foreign Application Priority Data

| Sep. 20, 1999 | (JP) | ............................ 11-265903 |
| Oct. 29, 1999 | (JP) | ............................ 11-309369 |
| Oct. 29, 1999 | (JP) | ............................ 11-309370 |
| Oct. 29, 1999 | (JP) | ............................ 11-309371 |

(51) Int. Cl.[7] .............................................. B65B 15/04
(52) U.S. Cl. .......................................... 53/591; 53/246
(58) Field of Search .................................. 53/246, 591

(56) References Cited

U.S. PATENT DOCUMENTS

| 3,878,026 | A | * | 4/1975 | Snyder et al. ................. 53/591 |
| 4,575,995 | A | * | 3/1986 | Tabuchi et al. ................ 53/591 |
| 5,564,262 | A | * | 10/1996 | Bevis et al. ................... 53/246 |
| 5,680,746 | A | * | 10/1997 | Hornisch ...................... 53/246 |
| 6,285,193 | B1 | * | 9/2001 | Kamitani ...................... 53/591 |

FOREIGN PATENT DOCUMENTS

| JP | 4-114822 | * | 4/1992 | ........... B65B/15/04 |
| JP | 7-329914 | * | 12/1995 | ........... B65B/15/04 |

* cited by examiner

Primary Examiner—Stephen F. Gerrity
(74) Attorney, Agent, or Firm—Morrison & Foerster LLP

(57) ABSTRACT

Electronic computers are brought to a position for a pickup by the movement of a X-Y table, then picked up by suction and held by a holding tool, and transported by the rotation of a rotating table. Then, after the completion of a posture-recognition procedure by a sensing device, the electronic components held by the holding tool are stored one by one in storage compartments within a tape while position of the holding tool with respect to the tape being adjusted by the movement of the X-Y table based on the result of the position recognition. Thus, the electronic components are securely stored in the tape without sacrificing the efficiency of production.

11 Claims, 9 Drawing Sheets

TAPING APPARATUS FOR ELECTRONIC COMPONENTS

TECHNICAL FIELD OF THE INVENTION

The present invention relates to a taping apparatus and process for electronic components, arid in particular, for storing chip-type electronic components in storage compartments within a tape, which is wound to a tape reel, and for sealing the upper opening of the storage compartment with a cover tape.

BACKGROUND OF THE INVENTION

A conventional taping apparatus and process for electronic components will be described hereinafter.

Conventionally, electronic components to be stored in a tape are placed in a feeding table, picked up and transported by a suction tool mounted on a rotating arm, and stored one by one in component-storage compartments within the tape. In this procedure, the components which are picked up to a deviated position with respect to the suction tool are pinched to a right position by a pair of position-setting hooks while being transported, and stored in the storage compartment in the tape.

One problem with this procedure is the danger of damaging the electronic components by regulating the position of the components with the position setting hooks. Specifically, it becomes difficult to set the components to a right position by the position-setting hooks when the size of the electronic components becomes small. While it is possible to mount the suction tool on a head moving the X and Y directions for picking up the electronic components from the component-feeding device and storing the same in the tape, this creates an inconvenience that the traveling time of the moving head increases. This results in a low production efficiency of storing the components. A second problem will be described hereinafter.

Conventionally, a procedure is repeated multiple times, wherein the chip-type electronic component is stored in the storage compartment within the tape, which is wound to the tape reel, and the tape is advanced by one pitch. The electronic component thereof is transported in the storage compartment within the tape to a predetermined position, and is taped by sealing the upper opening of the storage compartment within the tape with the cover tape.

However, in the procedure described above, the electronic components are stored in the storage compartments one at a time, and each time the tape main body is advanced downstream by one pitch using a tape-transporting mechanism, resulting in an increasing procedure time for the tape transportation.

Furthermore, the vibration (braking) and other adversary effects, which are caused by starting or stopping the transportation of the tape, bring about the popping out of the electronic components from the storage compartments and other undesirable disorders. This makes the conventional one-pitch advancing scheme, which cannot avoid the cumulative number of transportation (braking), subject to the inconvenience caused by the increasing effect of the vibration.

Conventional taping apparatus also lack the capability of automatically measuring or sensing the state of the electronic components and the compartments in the tape for storing the same. This is increasingly becoming an issue as the size of the electronic components are decreasing and a precision control of the taping procedures are becoming more difficult.

SUMMARY OF THE INVENTION

The present invention securely stores the electronic components in a tape without sacrificing the production efficiency.

In one embodiment of the taping apparatus and the taping process for the electronic components of the present invention, chip-type electronic components are stored in a tape, the electronic components are brought to the proper position for the pickup and are sucked up and held by a holding tool placed on a X-Y table. Then, the electronic components held by the holding tool are observed by a sensing device while being transported by the rotation of a rotating table. The position of the holding tool with respect to the tape is adjusted by moving the X-Y table based on the result of the position recognition, and the electronic components held by the holding tool are stored in the storage compartments in the tape one by one, constituting the characteristics of the invention. This increases the productivity of storing the components since multiple holding tools pick up the electronic components one by one and store the same in the storage compartments in the tape making use of the rotation of the rotating table.

As the rotating table equipped with the holding tools is mounted on the X-Y table, the positions of the holding tool and electronic components held by the holding tool with respect to the tape can be changed or adjusted by moving the X-Y table, whereby it is possible to correct the position of the electronic components misplaced in a deviated position with respect to the holding tool, without causing any damage to the electronic components as in the case of the conventional position-adjusting method using the hooks for position setting and other tools.

Furthermore, in another embodiment, the taping apparatus and process for the electronic components have a component-feeding device including another X-Y table for feeding which moves in the X and Y directions on the X-Y table and the electronic components are juxtaposed in a matrix on the table.

Therefore, while the position of the electronic component held by the holding tool is being adjusted with respect to the storing position in the tape, the electronic component to be picked up next is brought to the pickup position by moving the feeding table on the X-Y table in the X and Y directions, resulting in smooth component feeding.

Furthermore, in still another embodiment, the taping apparatus and the taping process for the electronic components of the present invention have a thrusting device, on the X-Y table, for pushing up the electronic components which are juxtaposed on the feeding table.

This enables the thrusting device to perform the action of thrusting the electronic component at a fixed position for the pickup by the holding tool with respect to the X-Y table, while the X-Y table is being moved.

Furthermore, in yet another embodiment, the taping apparatus and process for the electronic components of the invention have a component-posture sensing device for recognizing the position of the electronic component held by the holding tool is mounted, on the X-Y table, along the transportation passage of the electronic component.

This makes it possible to recognize the position of the electronic component held by the holding tool while the X-Y table being moved, thereby enabling the X-Y table to move for adjusting the position of the electronic component based on the result of the position recognition.

Furthermore, in another embodiment, the taping apparatus and process for the electronic components of the present invention have a feeding-position sensing device for recognizing the position of the electronic component fed by the electronic-component feeding device is equipped on the X-Y table.

This makes it possible to recognize the position of the electronic component fed by the feeding device while the X-Y table being moved, and the result of the position recognition is used during the storing procedure of the electronic component to the storage compartment in the tape.

The invention also discloses decreasing the time for the taping procedure.

To decrease the time for the taping procedure, in one embodiment, in the taping apparatus and process for the electronic components of the present invention, the apparatus and process for storing chip-type electronic components in storage compartments within a tape, which is wound to a tape reel, and for sealing the upper opening of the storage compartment with a cover tape, the procedure for storing the electronic component is repeated a plurality of times, wherein the electronic component on the feeding table is picked up by the holding tool of the component-storage mechanism and stored in the compartment, and after the repetition of the procedure storing the component, the main tape body is advanced downstream by a predetermined set of pitches using a tape-transporting mechanism.

Thus, it is possible to reduce the time for the tape transportation compared to the conventional one-pitch procedure.

Furthermore, the taping apparatus and process for the electronic components of the invention may include a storage-position sensing device for recognizing the waiting position of a plurality of storage compartments for storing the electronic components by the component-storage mechanism.

Herein, the number of the plurality of the storage compartments, which corresponds to the predetermined pitches of advancing the tape, is determined by the sensing area (field of vision) of the storage-position sensing device, thus, it is possible to appropriately set up the time for the tape transportation depending on the sensing area.

Furthermore, the efficiency of the storage procedure of the electronic components increases, since the storage-position sensing device recognizes the waiting position of the plurality of storage compartments for storing the electronic components by the component-storage mechanism beforehand.

Still furthermore, the taping apparatus and process for the electronic components of the present invention may have a tape-position regulating mechanism for regulating the position of the tape at a location outside the sensing area of the storage-position sensing device observing a plurality of the storage compartments.

Thus, the efficiency of the storage procedure of the electronic components increases, since the main tape body is restrained by the tape restraining mechanism so that the contact of the holding tool to the main tape body and the other adversary effects such as mechanical vibrations do not change the position of the storage compartments while the electronic components being stored.

The present invention resolves the problem caused by the time reduction scheme for the tape transportation, which will be described hereafter. After a procedure for storing the electronic component in the storage compartment is repeated a plurality of times, the main tape body is advanced downstream at one time by a predetermined set of pitches using a tape-transporting mechanism.

That is, there is a concern that the electronic components may pop out from the storage compartments while the tape is being transported after storing the electronic components in the storage compartments. In the widely accepted conventional design, along the transportation passage, the upper side of the tape is protected by a cover so that the tape is protected during the transportation and the popping out from the components are restrained. An opening is often created in the portion of the protecting cover in which the storage procedure for the components is performed. Though the design above does not provide any inconvenience in the scheme that the tape is transported each time when a single electronic component is stored in the storage compartment, a larger opening is needed which corresponds to a plurality of storage compartments for storing a plurality of the electronic components in the scheme of the present invention that a plurality of the electronic components are transported at one time after being stored in the storage compartments.

This creates a disorder of popping out of the electronic components from the storage compartments due to the vibration (braking) caused by starting or stopping the tape transportation.

Therefore, to solve the problem above, the taping apparatus and process for the electronic components of the present invention have an upper opening of the plurality of storage compartments covered by a shutter while the tape is being advanced downstream by the predetermined set of pitches using the tape-transporting mechanism, after a procedure is repeated a plurality of times, wherein the electronic component on the feeding table is picked up by the holding tool of the component storage mechanism, and stored in the storage compartment based on the result of position recognition by the storage-position sensing device.

This prohibits the popping out of the electronic components from the storage compartments while the tape is being advanced by the predetermined set of pitches using the tape-transporting mechanism.

Furthermore, in another embodiment, the taping apparatus and process for the electronic components of the present invention have a tape-restraining mechanism which keeps the position of the tape at a location outside the sensing area of the storage-position sensing device observing a plurality of the storage compartments.

This improves the efficiency of the procedure of storing the electronic components in the storage compartments within the tape.

Furthermore, in the taping apparatus and process for the electronic components of the present invention, the shutter is linked to the movement along the Y direction of the component-storage mechanism.

Therefore, the efficiency of the procedure improves, and the insecure storing forms of the electronic components due to the electrostatic charges, the vibration, the hooking, and other adversary effects during storing are regulated by moving the shutter while the holding tool is being moved.

Based on the present invention, it is also possible to increase the reliability of the testing of the electronic properties of the electric components for the taping.

That is, conventionally, there is a possibility of the occurrence of the problem described hereinafter, since the testing of the electronic properties of the electric components by a component-testing mechanism is performed prior to storing the electronic components in the storage compartments within the tape.

For example, when the component-storage mechanism has the widely accepted suction tool which picks up the component by sacking the upper surface of the same and transports the electronic components by suction, naturally the suction tool needs to contact the upper surface of the electronic components. Then, there is a danger of making the components defective upon the impact of the suction tool. Thus, it is possible that the electronic component judged as non-defective at the time of the testing becomes defective before the same is stored in the storage compartment within the tape after the completion of the testing, resulting in the introduction of the defective components into the tape.

Therefore, to solve the problem above, in one embodiment, in the taping apparatus and process for the electronic components of the present invention the electronic component is tested in the storage compartment by a component-testing mechanism, after the electronic components are picked up on the feeding table by the holding tool of the component-storage mechanism one by one. The tape is then transported to a predetermined position by the tape-transporting mechanism with the electronic components being stored in the storage compartment in the tape.

This makes it possible to suppress the introduction of the defective electronic components, conventionally taking place between the completion of the testing and the storing the electronic components in the storage compartments within the tape.

Furthermore, in the taping apparatus and process for the electronic components of the present invention, the component-testing mechanism has a plate for restraining the components as component-position regulating mechanism which regulates the positions of the electronic components in the storage compartment. This increases the reliability of testing the electronic components in the storage compartments.

The above descriptions of the present invention and the advantages of the same will become more apparent from detailed description given hereinafter accompanied by the drawings.

DETAILED DESCRIPTION OF PREFERRED EMBODIMENTS

The taping apparatus and the taping process for the electronic components associated with the present invention will be described hereinafter in reference to the drawings thereof.

Figure 1:
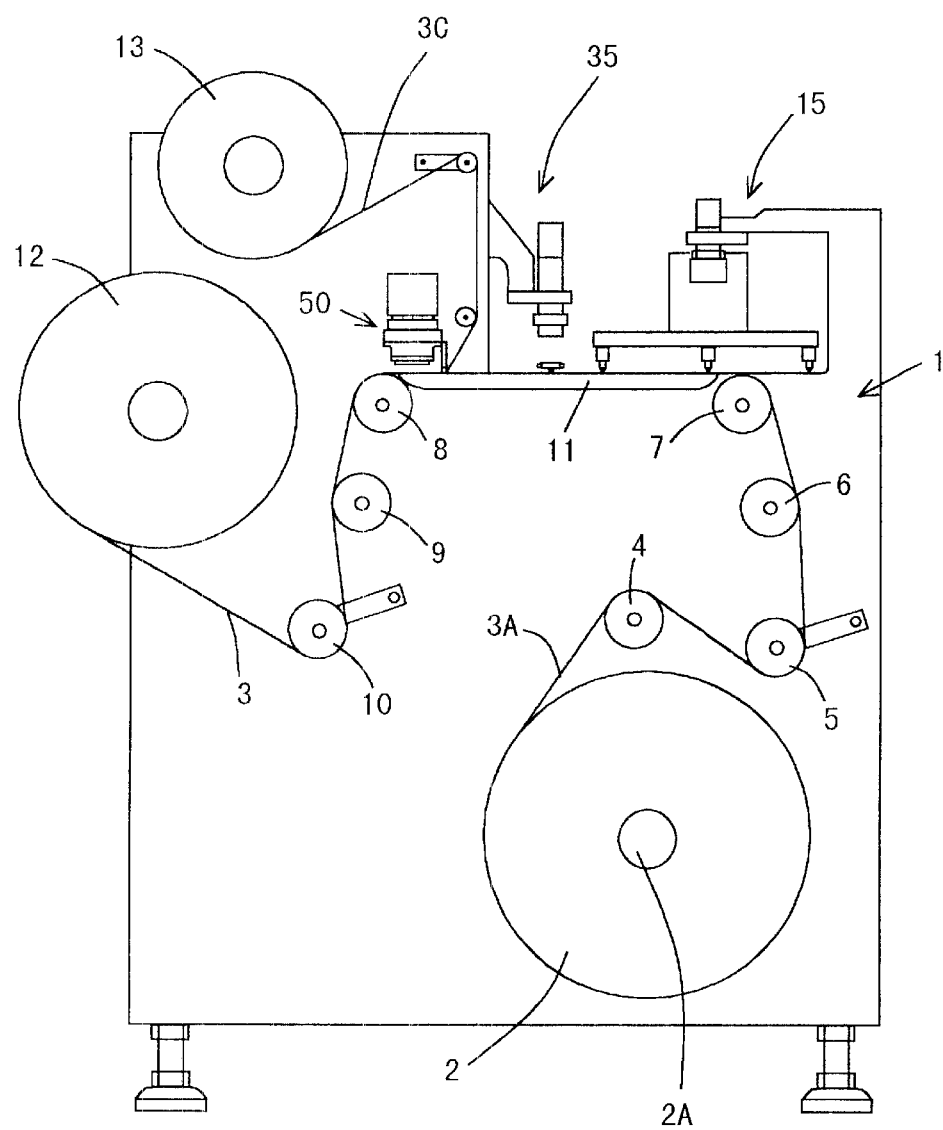
FIG. 1 is a front view of the taping apparatus for electronic components according to an embodiment of the invention.

FIG. 1 is a front view of a taping apparatus for the electronic components to which the present invention is applied. Referring to the figure, there is a base 1 of the taping apparatus on which mounted is a tape-transporting device as a tape-transporting portion for transporting the tape. A tape reel 2 is hooked on a pin 2A fixed on the sidewall of the base 1 so that the tape reel 1 can rotate around the pin 2A. One end of the tape body 3A (also known as carrier tape) is bound to a winding reel 12 through pulleys 4, 5, 6, 7, 8, 9, 10 for putting an appropriate tension to the tape body 3A, and transporting rail 11. The electronic components are stored in storage compartments 3B within the main tape body 3A, in between the transportations of the tape (windings of the reel 12) transported by a predetermined set of pitches by the rotation of the reel 12 driven by a driving system not shown in the figure. Then, the electronic components are transported to a predetermined position wherein the upper opening of the storage compartment 3B is sealed with the cover tape 3C which is fed from a cover tape-feeding reel 13. The main tape body 3A is then wound by the winding reel 12. As described above, the tape 3 is comprised of the main tape body 3A, the storage compartments 3B (see FIG. 3), which is created within the main tape body 3A, for storing the electronic components along the longitudinal direction of the tape with a predetermined interval, and the cover tape 3C which seals the upper opening of the storage compartments 3B.

Figure 2:
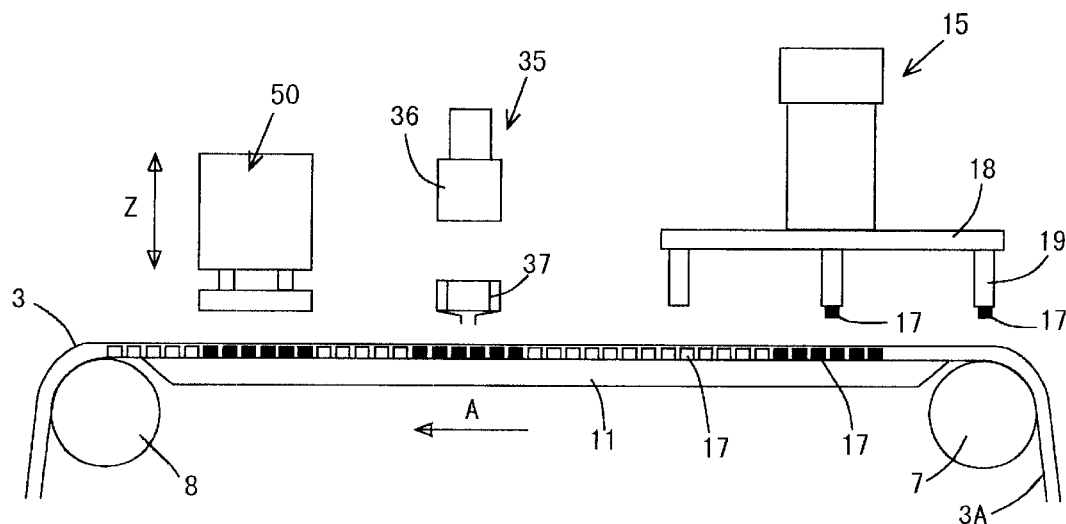
FIG. 2 is an expanded view of a portion of FIG. 1.

FIG. 2 is an expanded view of a portion of FIG. 1 to show the various kinds of work processes performed in the taping apparatus, with the arrow (arrow A in FIG. 2) pointing to the downstream along the direction of the tape transportation. Those are, from the upstream, the component-storage process by the component-storage mechanism 15 for storing the components in the storage compartments 3B within the main tape body 3A, the component-testing process by the component-testing mechanism 35, and the press-sealing process by the tape-sealing mechanism 50 for sealing the main tape body 3A with the cover tape 3C. In the figure, the electronic components 17 to be treated at each work process are indicated with the solid black boxes for the viewing convenience.

Figure 3:
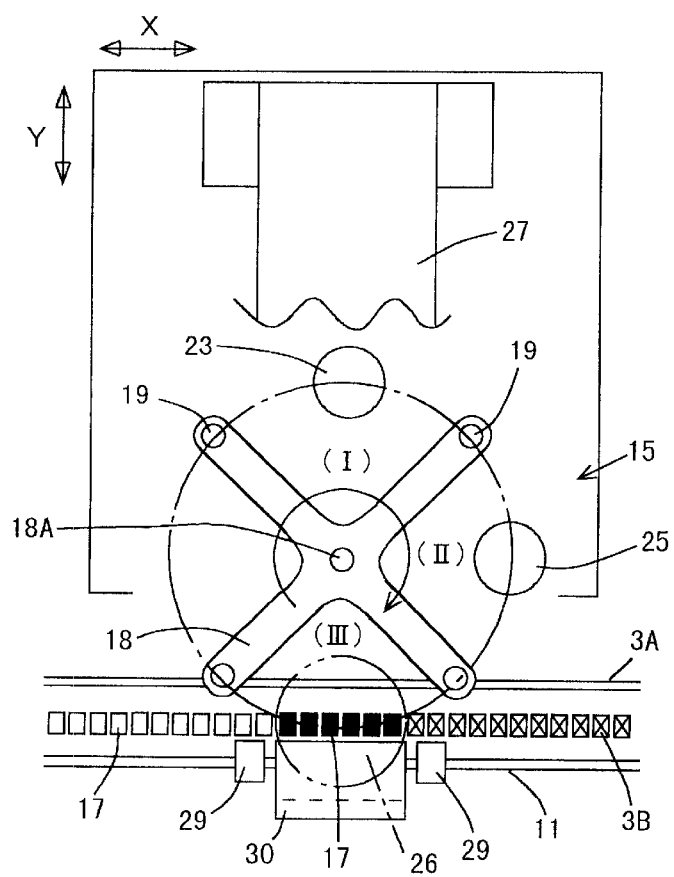
FIG. 3 is a plan view to show the component-storage mechanism.
Figure 4:
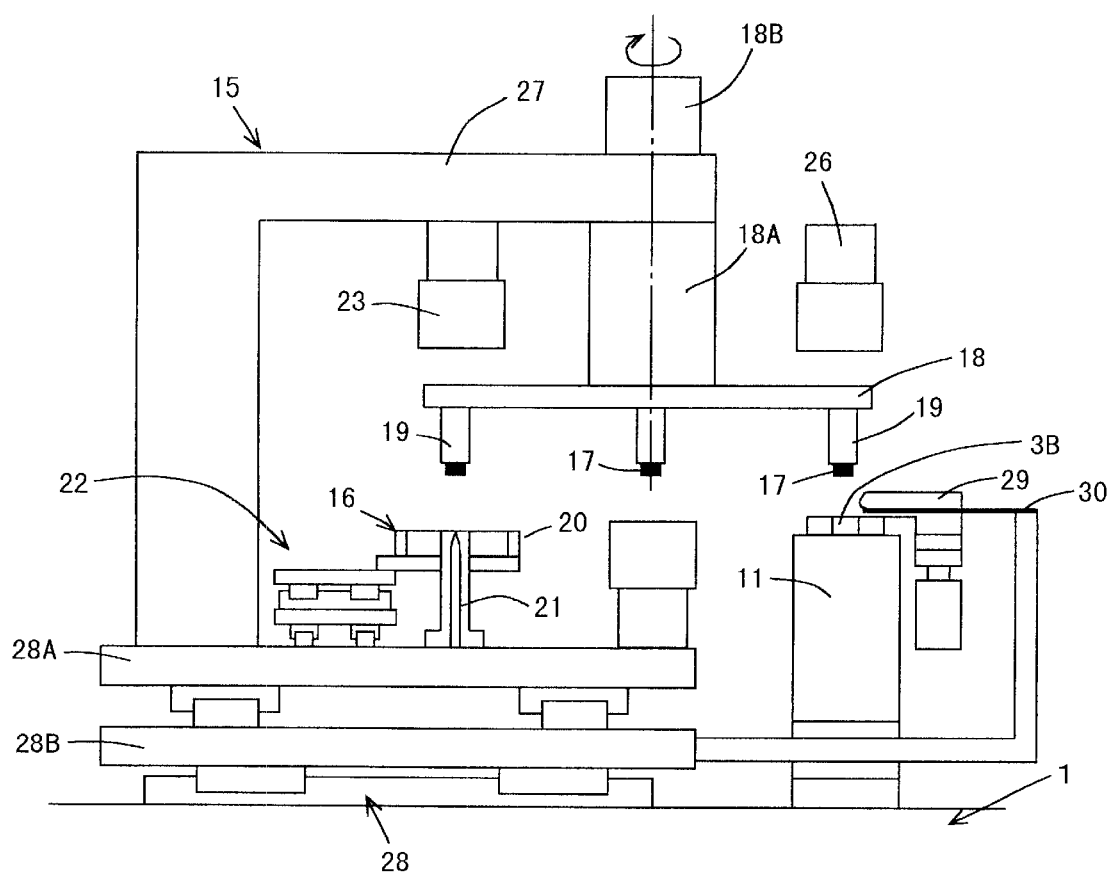
FIG. 4 is a side view to show the component-storage mechanism.
Figure 5:
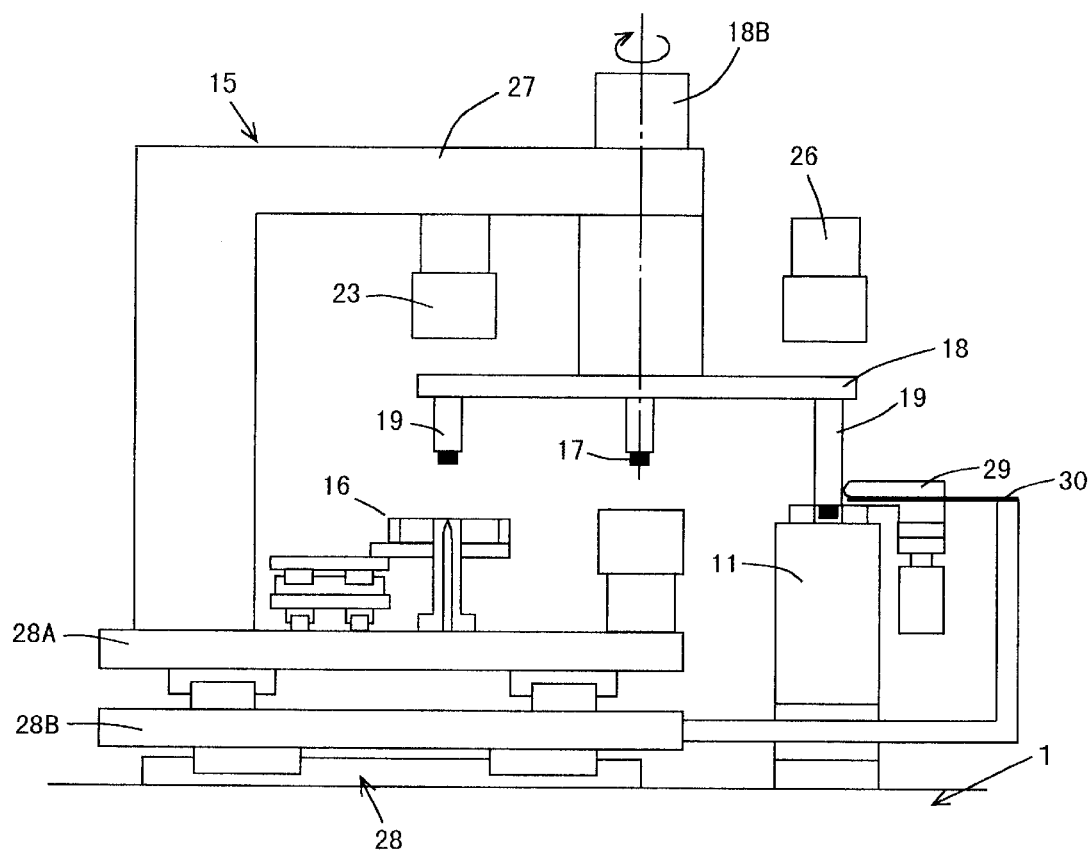
FIG. 5 is a side view to show the component-storage mechanism.
Figure 6:
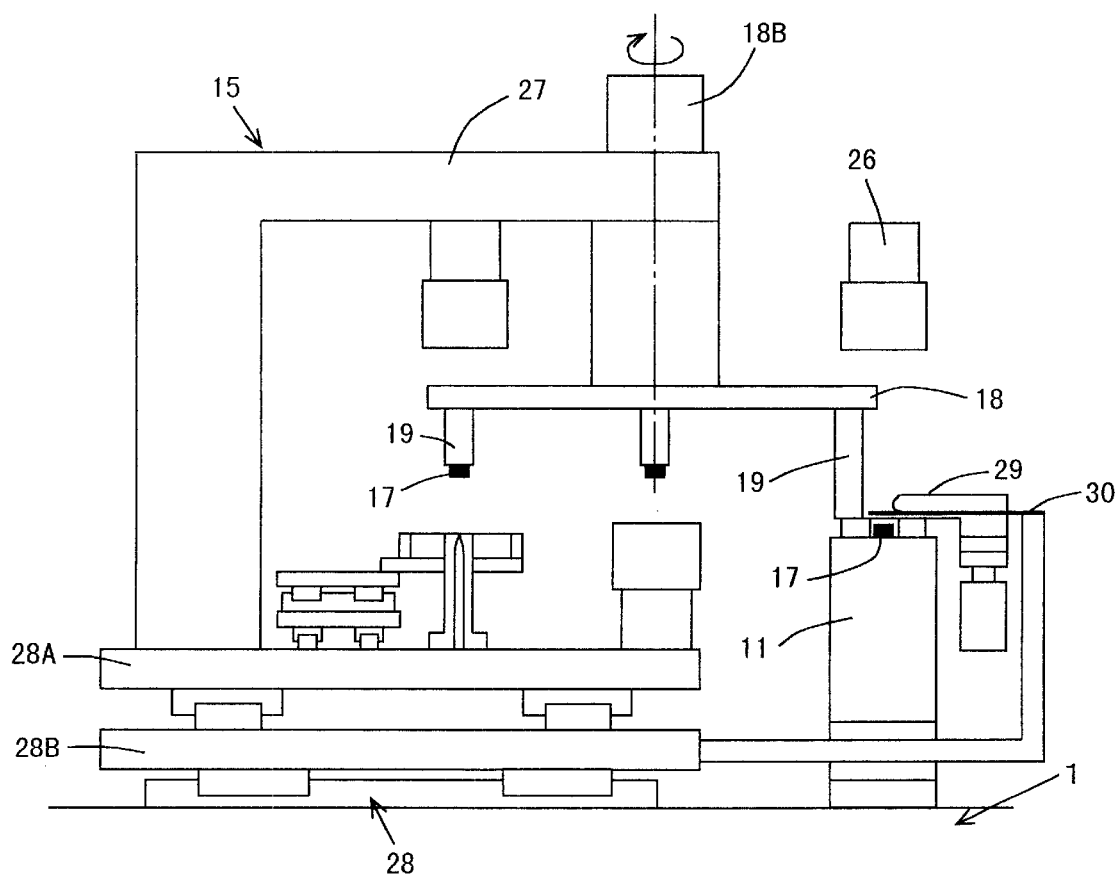
FIG. 6 is a side view to show the component-storage mechanism.

The component-storage mechanism 15 for storing the electronic components in the storage compartments 3B within the main tape body 3A will be described hereinafter in reference to the plan view thereof (FIG. 3) and the side views thereof (FIG. 4 through FIG. 6).

At the component-pickup station (I), the electronic components 17 on the feeding table 16 working as the component-feeding device are picked up one by one, by the four suction nozzles 19 working as the holding tools which are mounted on the back side of the far end of the rotating table 18 of the component-storage mechanism 15 with the equivalent interval. In other words, the four nozzles are configured around a pivot 18A with an interval of 90 degree. Then, the electronic components 17 picked up by the suction nozzle 19 are transported to the next station by the rotation of the rotating table 18 driven by a rotating motor 18B.

It is possible, if needed, to vertically move or rotate the suction nozzles 19 by an elevating mechanism and a rotating mechanism, both of which are not shown in the figure. The electronic components 17 which are picked up by suction from the feeding table 16 as described above are held by the suction nozzles 19, and transported by the rotation of the rotating table 18 to a predetermined position for being stored in the storage compartments 3B within the tape 3.

Though the details will be described hereinafter, the rotating table 18 is mounted on an arm 27 fixed on the second X-Y table 28 so that the table 18 is able to move along the X and Y directions with respect to the base 1 by moving the X-Y table 28 along the X and Y directions. That is, the X-Y table 28 is capable of bringing the arm 27 (rotating table 18) to any predetermined positions within the reach of the arm on the horizontal plane.

Furthermore, the position for picking up the electronic components 17 and the position for storing the same in the storage compartments 3B within the tape 3 are fixed in the coordinate system of the X-Y table 28, and the rotating table 18 rotates intermittently so that the suction nozzles 19 stop at the positions for pick up and storage.

Still furthermore, on the feeding table 16, a wafer is glued to a placement table 20 comprised of a circular frame using an elastic dicing tape with each electronic component 17 being separated and juxtaposed in a matrix. The push-up pin 21 pushes up the electronic component 17 from the backside of the wafer so that each electronic component 17 comes to a right position for the pickup by the nozzle 19 which comes to the position by the rotation of the rotating table 18.

Herein, being juxtaposed in a matrix is defined as a configuration wherein the electronic components 17 are placed with approximately equal intervals both in the X and Y directions.

The first X-Y table 22 can move the placement table 20 in the X and Y directions so that the target electronic component 17 comes to the position for pushing up by the push-up pin 21. And, the sensing camera 23 is placed above the push-up pin 21 and used as the feeding-position sensing device for imaging and recognizing the electronic components 17 on the wafer.

The component-recognition station (II) is the next stop for the electronic components 17 which are picked up by the suction nozzles 19 at the component-pickup station (I) and transported by the rotation of the rotating table 18. The component-recognition station (II) is equipped with the sensing camera 25 as a component-posture sensing device for imaging and recognizing from below the electronic components 17 which are held by the suction nozzles 19. The sensing camera 25 detects the posture of the electronic components 17 and the presence of the same. At this time, in the previous component-pickup station (I), the next electronic component 17 in the wafer is picked up by the suction nozzle 19 which has arrived at the station.

The component-storage station (III) is the next stop for the electronic components 17 which are held by the suction nozzles 19, and transported by the rotation of the rotating table 18 after the sensing procedure at the component-recognition station (II). At the component-storage station (III), the electronic components 17 held by the suction nozzles 19 are stored in the storage compartments 3B within the main tape body 3A which are placed along the transporting rail 11 below the nozzle.

At this time, before the electronic components 17 are stored in the storage compartments 3B, the position of the electronic components 17 is adjusted, based on the result of the posture recognition of the sensing camera 25, by moving the X-Y table 28 in the X and Y directions and rotating the suction nozzles 19. The electronic components 17 are stored in the storage compartments 3B with the bottom side facing upward so that those are handled easily by the component-testing mechanism 35 which will be described hereinafter. Furthermore, though not shown in the figures, there is a cover above the main tape body 3A placed on the transporting rail 11 for protecting the tape while being transported and preventing the popping out of the components. The cover has openings at the portions corresponding to the position for the component-storage procedure and the position for the component-testing procedure. In this embodiment, the opening is equivalent to 6 storage compartments, as 6 electronic components constitute one procedure unit. The number of the electronic components includes one unit, 6 in this embodiment, is determined by the number of the storage compartments 3B within the field of the vision of the sensing camera 26, which will be explained hereinafter. However, in other embodiment of the invention, the number can take any number depending on the extent of the sensing area (field of vision) of the sensing camera 26 without being confined to the number 6 of this embodiment. Thus, this creates room for changing the tape transportation time by the tape-transporting mechanism, which will be described hereinafter, depending on the number.

First, the position of the storage compartment 3B is recognized by the sensing camera 26 working as the storage-position sensing device, and the result of the recognition is combined with the result of the posture recognition of the component at the previous component-recognition station (II) so that the arm 27 having the rotating table 18 moves properly in the X and Y directions with respect to base 1 of the taping apparatus by the movements of the X table 28A and Y table 28B of the second X-Y table 28. Thus, the electronic components 17 are stored properly in the storage compartments 3B.

The tape-restricting mechanism 29 is a pair of tape-restricting plates which move vertically for holding the storage compartments 3B to a constant position against the adversary effects during storing such as the contact by the suction nozzle 19 to the main tape body 3A and mechanical vibrations. The plates are mounted outside the sensing area of the sensing camera 26. For example, the downward movement of the rod portion of a cylinder can be used to push the tape-restricting plates for pressing the upper surface of the main tape body 3A for holding the main tape body 3A.

Furthermore, the shutter 30 seals the upper opening of the storage compartments 3B after the electronic components 17 are stored in the storage compartments 3B, the movement of which is linked to the movement of the Y table 28B of the X-Y table 28. Thus, the opening is sealed by the shutter moving along the Y direction when the rotating table 18 moves toward left in the plane of FIG. 6 (direction away from the transporting rail 11) by the movement of the Y table 28B along the Y direction after the electronic components 17 are stored in the storage compartments 3B (FIG. 4 is the side view of the apparatus just before the electronic components 17 are stored in the storage compartments 3B. FIG. 5 is the side view of the apparatus while the electronic components 17 are being stored in the storage compartments 3B. FIG. 6 is the side view of the apparatus when the shutter 30 seals the upper opening of the storage compartments 3B after the electronic components 17 are stored in the storage compartments 3B and the suction nozzle 19 is separated away from the electronic component 17.)

In the present invention, the component-storage mechanism 15 (the suction nozzle 19) and the shutter 30 are both fixed on the X-Y table 28 for linking the movements along Y direction together, so that while the Y table 28B move along the Y direction with the electronic components 17 being stored in the storage compartments 3B, the separation of the nozzle 19 from the electronic component 17, which remains in the storage compartments 3B, and the sealing of the upper opening of the storage compartments 3B takes place at the same time. Since just one movement of the Y table 28 along the Y direction performs the two procedures above, the efficiency improves.

Figure 7:
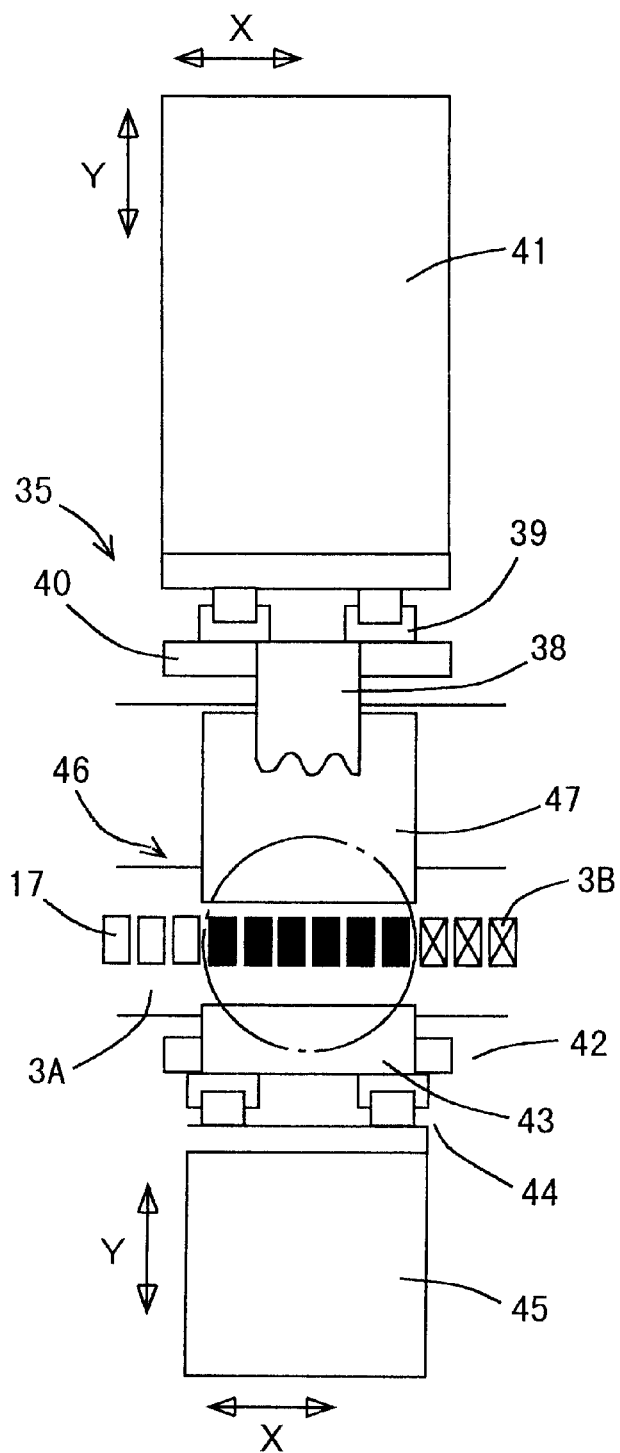
FIG. 7 is a plan view to show the component-testing mechanism.
Figure 8:
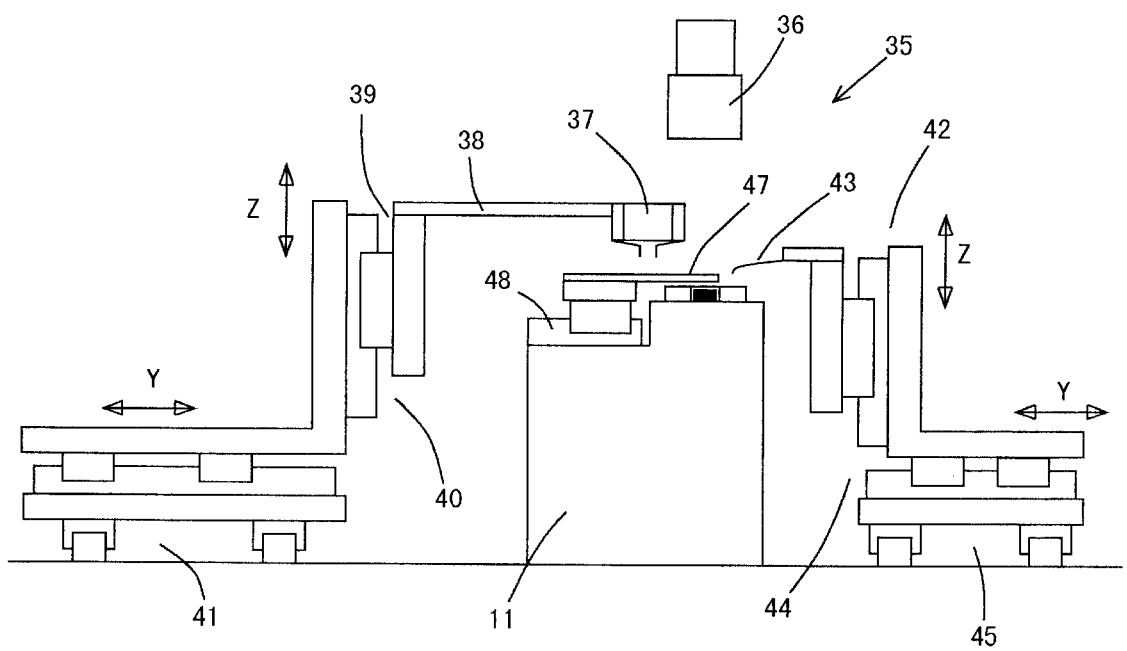
FIG. 8 is a side view to show the component-testing mechanism.
Figure 9:
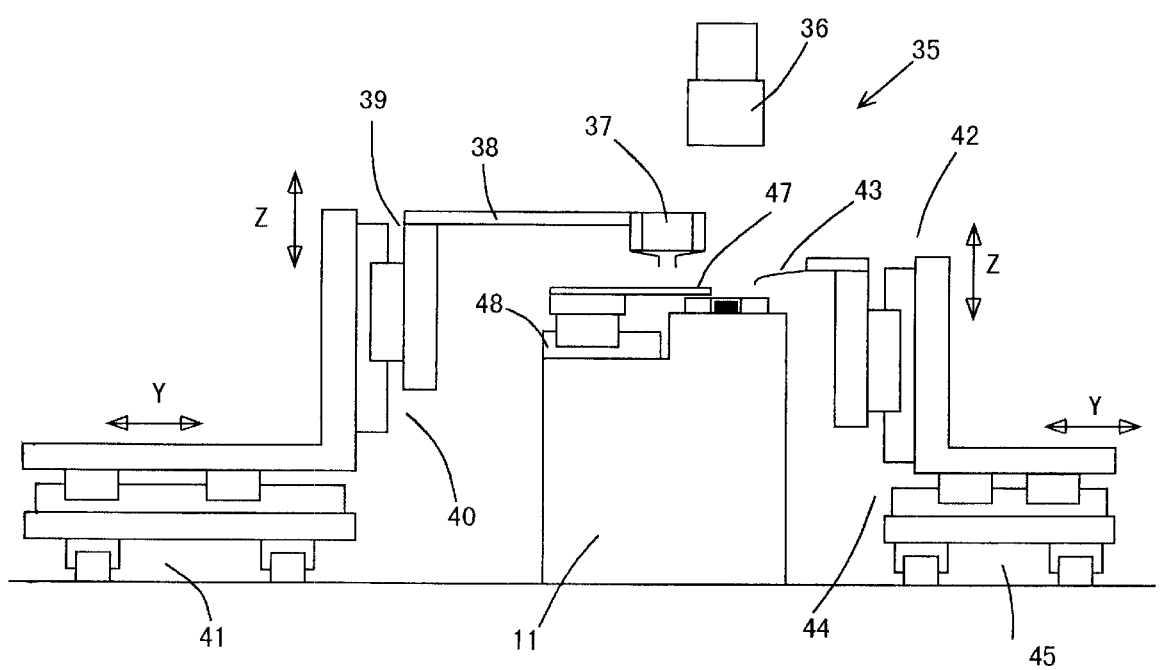
FIG. 9 is a side view to show the component-testing mechanism.
Figure 10:
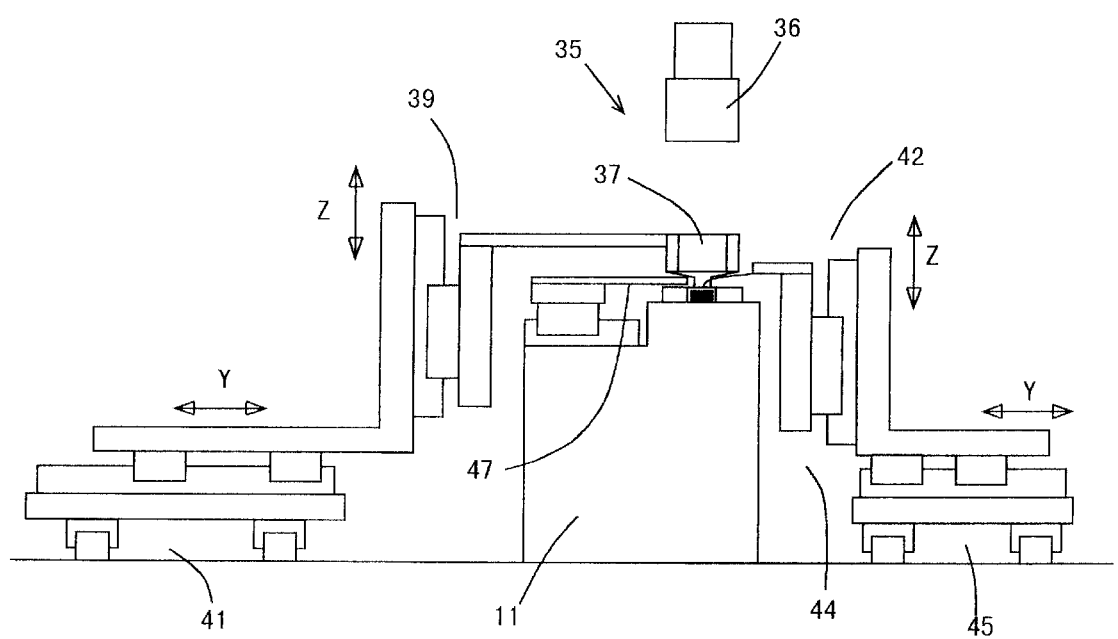
FIG. 10 is a side view to show the component-testing mechanism.

The component-testing mechanism 35 is used for the performing the testing of the electronic components 17 stored in the storage compartments 3B within the main tape body 3A, the details of which will be described hereinafter in reference to the plan view drawing thereof (FIG. 7) and side view drawings thereof (FIG. 8 through FIG. 10).

In FIG. 2, FIG. 8 and others, the sensing camera 36 working as the storage-state sensing device is mounted above the electronic components 17 stored in the storage compartments 3B for recognizing the posture of the electronic components 17 stored in the storage compartments 3B (In FIG. 7 the sensing area thereof is indicated by a dashed line).

In FIG. 8, the testing portion 37 having a proving needle underneath is mounted on the arm 38, which moves vertically along the guide 39, and the elevating mechanism thereof 40 is mounted on a X-Y table 41. Thus, the testing portion 37 approaches and contacts the electronic components 17 stored in the storage compartments 3B by moving the X, Y, and Z directions for the testing of the same. FIG. 8 is the side view of the component-testing mechanism when the electronic components 17 stored in the storage compartments 3B are transported to the position for the testing (At this point, the area above the electronic components 17 to be tested is covered by a shutter 47, which will be described hereinafter). FIG. 9 is the side view of the component-testing mechanism when the electronic components 17 in the storage compartments 3B are exposed after the shutter 47 moves along the Y direction. FIG. 10 is the side view of the component-testing mechanism when the testing of the electronic components 17 in the storage compartments 3B is taking place with the electronic components 17 being held by a component-restricting plate 43, which will be described hereinafter, and being contacted by the proving needle of the testing portion 37. In the testing procedure, as 6 electronic components 17 are tested by the testing portion 37 at one time, the cover has an opening equivalent to 6 storage compartments 3B as is the case with the storage procedure.

Also, the component position-regulating mechanism 42 is used to eliminate the position shifting of the electronic components 17 stored in the storage compartments 3B during the component testing by the testing portion 37, and has the component-restraining plate 43 for restraining 6 electronic components 17 mounted on a vertical elevating mechanism 44, which is fixed on a X-Y table 45. Thus, the component-restraining plate can move in the X, Y, and Z directions as in the case with the testing portion 37.

Furthermore, the transporting rail 11 has the shutter 47 for covering the space above the electronic components 17 prior to the testing by the testing portion 37, and the shutter can move in the Y direction along the Y movement guide 48.

Finally, the press-sealing mechanism 50 can move vertically, and adheres, by the press-sealing, the cover tape 3C to the main tape body 3A which has the electronic components 17 in the storage compartments 3B after the testing of the same. Thus, the electronic components 17 are taped.

A sequence of operations of the invention will be described hereinafter.

First, at the component-pickup station (I), as the rotating table 18 starts to rotate, the suction nozzle 19, which has rested at the position for picking up components, moves away from the pickup position (Refer to FIG. 3). Then, the sensing camera 23 regains the view of the electronic components 17 juxtaposed in a matrix, and a plurality of electronic components 17 within a predetermined range are being imaged. In this range of the visible field is included the electronic component 17 for the next pickup.

Next, among the electronic components 17 supplied by the wafer on the feeding table 16, the electronic component 17 for the next pickup is recognized through an image processing, and then brought to the position for the pickup by the horizontal movement of the feeding table 16 driven by a control device not shown in the figure.

Then, the suction nozzle 19, which is circling by the rotation of the rotating table 18, comes to a stop at the pickup position, and the push-up pin 21 approaches to the back side of the targeted electronic component 17 and pushes the same through the dicing tape. At the same time, the suction nozzle 19 descends and picks up the electronic component 17.

Next, as the rotating table 18 starts to rotate after the ascending of the suction nozzle 19, the electronic component 17 picked up by the suction nozzle 19 at the component-pickup station (I) is transported, next, to the component-recognition station (II) wherein the posture (including the presence of the electronic component) of the electronic component 17 held by the suction nozzle 19 is imaged by the sensing camera 25. Based on this result, the deviation of the position of the electronic component 17 with respect to the suction nozzle 19 and unsuccessful pickup are detected. However, in the description hereinafter, it is assumed that there is no unsuccessful pickup in the procedures.

Then, after the completion of the posture recognition, the rotation table 18 again starts to rotate, and the electronic component 17 is transported from the component-recognition station (II) to the component-storage station (III), wherein the electronic component 17 is brought to the exact position of the storage compartment 3B for storing the same by the horizontal movement of the X-Y table 28 depending on the position of the electronic component 17 recognized by the sensing camera 25. If the result of the posture recognition of the electronic component 17 indicates that there is an angular deviation around the vertical axis, the suction nozzle 19 rotates to a right position around the vertical axis for correcting the deviation.

Then, the suction nozzle 19 holding the electronic component 17 descends, and stores properly the same in a proper storage compartment 3B. At this point, the tape-restraining mechanism 29 also descends and restrains the main tape body 3A, for holding the storage compartments 3B to a constant position against the adversary effects during storing such as the contact by the suction nozzle 19 to the main tape body 3A and mechanical vibrations. Thus, stable procedures for storing the electronic components 17 are achieved.

In the same manner, the next electronic component 17 is stored in the next storage compartment 3B. And, after the 6 storage compartments 3B are occupied by the electronic components 17, the main tape body 3A is transported downstream and another set of 6 storage compartments 3B are brought to the component-storage station (III). Though the X-Y table 28 moves during the storage procedure as described above, other procedures performed by the suction nozzle 19 is not susceptible to the movement as the procedures are performed at a same location with respect to the X-Y table 28.

Furthermore, the upper opening of the storage compartments 3B is sealed with the shutter 30 so that the electronic components 17 stored in the 6 storage compartments 3B do not pop out from the storage compartments 3B because of the mechanical vibration and other adversary effects during the transportation. This makes the transportation procedures of the electronic components stable.

The shutter 30 is constructed so that the movement thereof is linked to the Y-direction movement of the Y table 28B of the X-Y table 28. After storing the electronic components 17 in the storage compartments 3B, the movement of the rotating table 18 toward left in the plane of FIG. 6 (away from the transporting rail 11) by the movement of the Y table 28B causes the shutter 30 to move along the Y direction for closing the opening by the shutter 30. The efficiency of the procedure improves as the movements of the rotating table 18 and the shutter 30 are controlled by the movement of Y table 28B along the Y direction. Also, the insecure storing form of the electronic components 17 in the storage compartments 3B due to the electrostatic charges, the vibration, the hooking, and other adversary effects during storing is also suppressed by moving the shutter 30 while the suction nozzle 19 is being moved.

Furthermore, in the present invention, the sensing camera 26 recognizes the positions of a plurality of storage compartments 3B (6 in this embodiment) at one time, then the electronic components 17 are stored in the storage compartments 3B one by one. The scheme thereof in which a plurality of electronic components 17 are stored in the storage compartments 3B in one series of the storage procedures and the main tape body 3A is advanced downstream by the tape-transporting mechanism by a plurality of pitches (6 in this embodiment) at one time has an advantage over conventional scheme in which only one electronic component 17 is stored in the storage compartment 3B at one time and the main tape body 3A is advanced downstream by the tape-transporting mechanism only by one pitch (This procedure needs to be repeated 6 time to match the procedure of the invention). That is, the time for the over all procedures is shorter in the present invention. For example, when advancing the tape by one pitch takes about 0.2 seconds, the conventional scheme needs about 1.2 seconds to repeat one procedure 6 times. On the other hand, the scheme of the present invention with 6-pitch tape advancement needs about 0.4 seconds to complete the transportation of the tape (Only the difference in the transportation time counts as the time for storing the electronic components 17 is not different).

Furthermore, conventionally, the vibration (braking) and other adversary effects at the start and the stop of the transportation movement of the tape cause the disorders such as the popping out of the electronic components 17 from the storage compartments 3B. However, in the present invention wherein one single tape transportation involves a plurality of pitches, as the number of the total transportation procedures decreases, the effects of the vibration becomes less accordingly in comparison to the conventional scheme wherein one single tape transportation comprises just one pitch advancement. Thus, present invention results in improved transportation reliability.

Then, the component testing is performed on the electronic components 17, which are stored in the 6 storage compartments 3B and transported to a predetermined position, by the transporting device.

First, the sensing camera 36 placed above the electronic components 17 stored in the storage compartments 3B recognizes the postures of the electronic components 17 stored in the storage compartments 3B. Then, the testing portion 37 having the proving needle, as shown in FIG. 8, approaches the electronic components 17 by moving in the X and Y directions and descending vertically, driven by the X-Y table 41 and elevating mechanism 40, for contacting and testing the electronic components 17.

At this time, as shown in FIG. 8, the electronic components 17 stored in the storage compartments 3B are protected by the shutter 47 which covers the space above the electronic components 17 until the start of the testing. Then, at the beginning of the testing, the electronic components 17 are exposed, as shown in FIG. 9, by moving the shutter 47 along the Y direction just. As shown in FIG. 10, while the component-restraining plate 43 restrains the electronic components 17 in the storage compartments 3B, the proving needle of the testing portion 37 contacts and tests the electronic components 17.

Thus, in the present invention, as the electronic properties of the electronic components 17 are tested along the transportation passage while the electronic components 17 are stored in the storage compartments 3B within the main tape body 3A, it is possible to eliminate the introduction of the defective components in the tape, which is the case as with the conventional testing procedure wherein the electronic components are brought to a testing table for the testing by the suction nozzle and then stored in the storage compartment 3B by the suction nozzle, creating a possibility of introducing the defective components due to the impacts of the sucking by the nozzle after the testing. Furthermore, the electronic components 17 are stored in the storage compartments 3B with the bottom side facing upward, so that those are handled easily by the component-testing mechanism 35, resulting in the efficiency of the procedure increases.

Furthermore, the component testing by the component-testing mechanism 35 needs to be performed at one location along the transportation passage between the position for storing the electronic components 17 in the storage components 3B and the position for press-sealing of the main tape body 3A with the cover tape 3C by the press-sealing mechanism 50, which will be described hereinafter. This results in the flexibility of placing the component-testing mechanism 35 within the taping apparatus.

Finally, the taping of the electronic components 17 stored in the storage compartments 3B by press-sealing mechanism 50 is performed by press-sealing, with the cover tape 3C, the main tape body 3A which contains the electronic components 17 in the storage compartments 3B tested by the component-testing mechanism 35. The electronic components 17 stored in the storage compartments 3B are taped.

Then, the tape 3, after the completion of the whole taping procedure is wound to the winding reel 12.

What is claimed is:

1. A taping apparatus for electronic components storing chip-type electronic components in a tape, comprising:
   a X-Y table configured to move along X and Y directions on a base;
   an electronic component-feeding device mounted on the X-Y table to feed the electronic components;
   a tape-transporting mechanism mounted on the base; and
   a plurality of holding tools fixed on movable arms mounted on the X-Y table so as to hold the electronic components fed by the electronic component-feeding device and configured to store the electronic components in the tape transported by the tape-transporting mechanism.

2. The taping apparatus for electronic components according to claim 1, wherein the component-feeding device is a feeding table to juxtapose the electronic components in a matrix and is configured to move along the X and Y directions on the X-Y table.

3. The taping apparatus for electronic components according to claim 1, wherein the X-Y table comprises a thrusting device to push up the electronic components juxtaposed on the feeding-table.

4. The taping apparatus for electronic components according to claim 1, further comprising a component posture-sensing device to recognize a position of the electronic component held by the holding tool, the component-sensing device being placed along a transportation passage of the electronic components transported by the holding tools on the X-Y table.

5. The taping apparatus for electronic components according to claim 1, further comprising a feeding position-sensing device to recognize a position of the electronic component fed by the electronic component-feeding device, the feeding position-sensing device being placed on the X-Y table.

6. The taping apparatus for electronic components according to claim 1, further comprising:

a component-storage mechanism configured to pick up the electronic components one by one from the electronic component-feeding device and to store the electronic components in storage compartments in the tape; and a component-testing mechanism to test the electronic components in the storage compartments that are transported to a predetermined position by the tape-transporting mechanism, the tape-transporting mechanism transporting by a predetermined amount the tape having the electronic components stored in the storage compartments.

7. The taping apparatus according to claim 6, wherein the component-testing mechanism has a component position-regulating mechanism to regulate the position of the electronic component in the storage compartment.

8. The taping apparatus for electronic components according to claim 1, further comprising:

a component-storage mechanism to pick up the electronic components one by one from the electronic component-feeding device and to store the electronic components in storage compartments in the tape; and a shutter mechanism configured to seal upper openings of a plurality of the storage compartments after a procedure to store the electronic components in the storage compartments is repeated a plurality of times for filling the plurality of storage compartments, the tape-transporting mechanism transporting the tape by a predetermined amount with the upper openings of the storage compartments being sealed by the shutter mechanism.

9. The taping apparatus according to claim 8, further comprising a storage position-sensing device equipped to recognize a waiting position of a plurality of the storage compartments in which the electronic components are designated to be stored by the component-storing mechanism.

10. The taping apparatus according to claim 9, further comprising a tape position-regulating mechanism to regulate the tape, the tape position-regulating mechanism being equipped outside a sensing area of the storage position-sensing device to recognize a plurality of the storage compartments.

11. The taping apparatus according to claim 8, wherein the shutter mechanism is linked to a movement of the component-storage mechanism toward a predetermined direction.

* * * * *